(12) United States Patent
Liang (10) Patent No.: US 11,088,244 B2
(45) Date of Patent: Aug. 10, 2021

(54) DEVICES HAVING SUBSTRATES WITH SELECTIVE AIRGAP REGIONS (71) Applicant: Hewlett Packard Enterprise Development LP, Houston, TX (US)

(72) Inventor: Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/082,268

(22) PCT Filed: Mar. 30, 2016

(86) PCT No.: PCT/US2016/024823
§ 371 (c)(1),
(2) Date: Sep. 4, 2018

(87) PCT Pub. No.: WO2017/171737
PCT Pub. Date: Oct. 5, 2017

(65) Prior Publication Data
US 2019/0081139 A1    Mar. 14, 2019

(51) Int. Cl.
*H01L 29/06* (2006.01)
*H01L 21/02* (2006.01)
(Continued)

(52) U.S. Cl.
CPC .... *H01L 29/0649* (2013.01); *H01L 21/02639* (2013.01); *H01L 21/0337* (2013.01);
(Continued)

(58) Field of Classification Search
CPC .............. H01L 21/7682; H01L 21/764; H01L 29/4991; H01L 29/0649
See application file for complete search history.

(56) References Cited

U.S. PATENT DOCUMENTS 4,408,330 A    10/1983  An
5,294,808 A    3/1994   Lo
(Continued)

FOREIGN PATENT DOCUMENTS

CN    1476132 A      2/2004
CN    101467083 A    6/2009
(Continued)

OTHER PUBLICATIONS

Haataja, M. et at: "Dislocations and Morphological Instabilities: Continuum Modeling of Misfitting Heteroepitaxial Films"; Apr. 5, 2002; 20 pages.
(Continued)

*Primary Examiner* — Marcos D. Pizarro
*Assistant Examiner* — Quinton A Brasfield
(74) *Attorney, Agent, or Firm* — Sheppard Mullin Richter & Hampton LLP (57) ABSTRACT Examples herein relate to devices having substrates with selective airgap regions for mitigating defects resulting from heteroepitaxial growth of device materials. An example device may include a first semiconductor layer disposed on a substrate. The first semiconductor layer may have a window cut through a face, where etching a selective airgap region on the substrate is enabled via the window. A second semiconductor layer may be heteroepitaxially grown on the face of the first semiconductor layer so that at least a portion of the second semiconductor layer is aligned over the selective air gap region.

20 Claims, 6 Drawing Sheets

(51) Int. Cl.
*H01L 21/764* (2006.01)
*H01L 21/762* (2006.01)
*H01L 21/033* (2006.01)
*H01L 21/20* (2006.01)
*H01L 21/768* (2006.01)

(52) U.S. Cl.
CPC ........ *H01L 21/2015* (2013.01); *H01L 21/762* (2013.01); *H01L 21/764* (2013.01); *H01L 21/7682* (2013.01)

(56) References Cited

U.S. PATENT DOCUMENTS

| | | |
|---|---|---|
| 5,512,375 A | 4/1996 | Green et al. |
| 5,764,670 A | 6/1998 | Ouchi |
| 5,883,009 A | 3/1999 | Villa et al. |
| 5,981,400 A | 11/1999 | Lo |
| 6,265,321 B1 * | 7/2001 | Chooi ................ H01L 21/7682 257/E21.579 |
| 6,288,426 B1 | 9/2001 | Gauthier et al. |
| 6,437,372 B1 | 8/2002 | Geva et al. |
| 6,475,873 B1 | 11/2002 | Kalnitsky et al. |
| 6,492,283 B2 | 12/2002 | Raaijmakers et al. |
| 6,493,476 B2 | 12/2002 | Bendett |
| 6,515,333 B1 | 2/2003 | Riccobene |
| 6,526,083 B1 | 2/2003 | Kneissl et al. |
| 6,585,424 B2 | 7/2003 | Chason et al. |
| 6,705,681 B2 | 3/2004 | Russ |
| 6,706,581 B1 | 3/2004 | Hou et al. |
| 6,849,866 B2 | 2/2005 | Taylor |
| 6,902,987 B1 | 6/2005 | Tong et al. |
| 7,087,452 B2 | 8/2006 | Joshi et al. |
| 7,217,584 B2 | 5/2007 | Yue et al. |
| 7,231,123 B2 | 6/2007 | Sugita et al. |
| 7,368,816 B2 | 5/2008 | Lim et al. |
| 7,560,361 B2 | 7/2009 | Frank et al. |
| 7,579,263 B2 | 8/2009 | Han et al. |
| 7,639,719 B2 | 12/2009 | Fang et al. |
| 7,817,881 B2 | 10/2010 | Li |
| 7,838,314 B2 | 11/2010 | Choi et al. |
| 7,869,473 B2 | 1/2011 | Ye et al. |
| 7,935,559 B1 | 5/2011 | Giffard et al. |
| 7,949,210 B2 | 5/2011 | Durfee et al. |
| 8,078,018 B2 | 12/2011 | Mouli |
| 8,106,468 B2 | 1/2012 | Wang et al. |
| 8,344,453 B2 | 1/2013 | Muller |
| 8,372,673 B2 | 2/2013 | Lee et al. |
| 8,488,917 B2 | 7/2013 | Manipatruni et al. |
| 8,502,279 B2 | 8/2013 | Toh et al. |
| 8,538,206 B1 | 9/2013 | Fish et al. |
| 8,664,087 B2 | 3/2014 | Chang et al. |
| 8,716,852 B2 | 5/2014 | Shu et al. |
| 8,937,981 B2 | 1/2015 | Liang |
| 9,018,675 B2 | 4/2015 | Bedell et al. |
| 9,059,252 B1 | 6/2015 | Liu et al. |
| 9,093,428 B2 | 7/2015 | Liang |
| 9,110,314 B2 | 8/2015 | Tu et al. |
| 9,240,406 B2 | 1/2016 | Feng et al. |
| 9,269,724 B2 | 2/2016 | Han et al. |
| 9,509,122 B1 | 11/2016 | Norberg et al. |
| 9,570,351 B2 | 2/2017 | Liang |
| 9,640,531 B1 | 5/2017 | Or-Bach et al. |
| 9,773,906 B2 | 9/2017 | Wang et al. |
| 2002/0081793 A1 * | 6/2002 | Yang ................ H01L 29/66757 438/200 |
| 2002/0094661 A1 | 7/2002 | Enquist et al. |
| 2002/0113288 A1 | 8/2002 | Clevenger et al. |
| 2002/0121337 A1 | 9/2002 | Whatmore et al. |
| 2002/0168837 A1 | 11/2002 | Hsu et al. |
| 2003/0006407 A1 | 1/2003 | Taylor |
| 2003/0025976 A1 | 2/2003 | Wipiejewski |
| 2003/0058902 A1 | 3/2003 | Yuen |
| 2003/0081642 A1 | 5/2003 | Hwang et al. |
| 2003/0134446 A1 | 7/2003 | Koike et al. |
| 2003/0169786 A1 | 9/2003 | Kapon et al. |
| 2003/0203550 A1 | 10/2003 | Lai |
| 2004/0028092 A1 | 2/2004 | Kim |
| 2004/0081386 A1 | 4/2004 | Morse et al. |
| 2004/0152272 A1 | 8/2004 | Fladre et al. |
| 2004/0184502 A1 | 9/2004 | Miyachi et al. |
| 2004/0206299 A1 | 10/2004 | Tadatomo et al. |
| 2004/0248334 A1 | 12/2004 | Hoss et al. |
| 2004/0257171 A1 | 12/2004 | Park et al. |
| 2004/0264530 A1 | 12/2004 | Ryou et al. |
| 2005/0081958 A1 | 4/2005 | Adachi et al. |
| 2005/0106790 A1 | 5/2005 | Cheng et al. |
| 2005/0139857 A1 | 6/2005 | Shin |
| 2005/0207704 A1 | 9/2005 | Keyser et al. |
| 2006/0035450 A1 | 2/2006 | Frank et al. |
| 2006/0063679 A1 | 3/2006 | Yue et al. |
| 2006/0181542 A1 | 8/2006 | Granger |
| 2007/0275505 A1 | 11/2007 | Wolterink et al. |
| 2008/0012145 A1 | 1/2008 | Jang |
| 2008/0018983 A1 | 1/2008 | Ishii et al. |
| 2008/0175294 A1 | 7/2008 | Kim et al. |
| 2008/0265377 A1 * | 10/2008 | Clevenger ........... H01L 21/7682 257/618 |
| 2008/0283877 A1 * | 11/2008 | Collonge ........... H01L 29/78654 257/254 |
| 2009/0080488 A1 | 3/2009 | Hatakeyama et al. |
| 2009/0101997 A1 | 4/2009 | Lammel et al. |
| 2009/0110342 A1 | 4/2009 | Webster et al. |
| 2009/0168821 A1 | 7/2009 | Fang et al. |
| 2009/0194152 A1 | 8/2009 | Liu et al. |
| 2009/0200636 A1 | 8/2009 | Edelstein et al. |
| 2009/0238515 A1 | 9/2009 | Fattal et al. |
| 2009/0242935 A1 | 10/2009 | Fitzgerald |
| 2009/0263076 A1 | 10/2009 | Mathai et al. |
| 2009/0302415 A1 | 12/2009 | Mueller et al. |
| 2010/0060970 A1 | 3/2010 | Chen |
| 2010/0098372 A1 | 4/2010 | Manipatruni et al. |
| 2010/0119231 A1 | 5/2010 | Kim et al. |
| 2010/0140629 A1 | 6/2010 | Lee et al. |
| 2010/0140739 A1 | 6/2010 | Kim |
| 2010/0215309 A1 | 8/2010 | Shubin et al. |
| 2010/0295083 A1 | 11/2010 | Celler |
| 2011/0026879 A1 | 2/2011 | Popovic et al. |
| 2011/0045644 A1 | 2/2011 | Barth et al. |
| 2011/0064099 A1 | 3/2011 | Govorkov et al. |
| 2011/0073989 A1 | 3/2011 | Rong et al. |
| 2011/0176762 A1 | 7/2011 | Fujikata et al. |
| 2011/0180795 A1 | 7/2011 | Lo et al. |
| 2011/0188112 A1 | 8/2011 | Stievater et al. |
| 2011/0211786 A1 | 9/2011 | Ushida et al. |
| 2011/0293216 A1 | 12/2011 | Lipson et al. |
| 2012/0002285 A1 | 1/2012 | Matsuda |
| 2012/0008658 A1 | 1/2012 | Chung |
| 2012/0091463 A1 * | 4/2012 | Yokogawa ........ H01L 21/02458 257/76 |
| 2012/0119258 A1 | 5/2012 | Liang |
| 2012/0189239 A1 | 7/2012 | Tu et al. |
| 2012/0257850 A1 | 10/2012 | Fujikata et al. |
| 2013/0009182 A1 | 1/2013 | Jung et al. |
| 2013/0009321 A1 | 1/2013 | Kagawa et al. |
| 2013/0029449 A1 | 1/2013 | Cheng et al. |
| 2013/0049203 A1 | 2/2013 | Ahrens et al. |
| 2013/0063226 A1 | 3/2013 | Burak et al. |
| 2013/0137202 A1 | 5/2013 | Assefa et al. |
| 2013/0147021 A1 | 6/2013 | Puurunen et al. |
| 2013/0152694 A1 | 6/2013 | Urvas et al. |
| 2013/0155484 A1 | 6/2013 | Sweatlock et al. |
| 2013/0168776 A1 | 7/2013 | Liang et al. |
| 2014/0141546 A1 | 5/2014 | Cho |
| 2014/0177994 A1 | 6/2014 | Chen |
| 2014/0264723 A1 | 9/2014 | Liang et al. |
| 2014/0307997 A1 | 10/2014 | Bar et al. |
| 2015/0055910 A1 | 2/2015 | Liang |
| 2015/0069418 A1 * | 3/2015 | Heo ................ H01L 21/02664 257/79 |
| 2015/0140720 A1 | 5/2015 | Collins |
| 2015/0144928 A1 * | 5/2015 | Forrest ................ H01L 51/56 257/40 |
| 2015/0177458 A1 | 6/2015 | Bowers et al. |
| 2015/0179447 A1 | 6/2015 | Ryou |

(56) References Cited

U.S. PATENT DOCUMENTS

| | | |
|---|---|---|
| 2015/0212266 A1 | 7/2015 | Czornomaz et al. |
| 2016/0094014 A1 | 3/2016 | Shin et al. |
| 2016/0126381 A1 | 5/2016 | Wang et al. |
| 2016/0202504 A1 | 7/2016 | Kim et al. |
| 2016/0238860 A1 | 8/2016 | Liang et al. |
| 2017/0077325 A1 | 3/2017 | Norberg et al. |
| 2017/0139132 A1 | 5/2017 | Patel et al. |
| 2017/0146740 A1 | 5/2017 | Orcutt et al. |
| 2017/0358607 A1 | 12/2017 | Balakrishnan et al. |

FOREIGN PATENT DOCUMENTS

| | | |
|---|---|---|
| CN | 100514099 C | 7/2009 |
| CN | 102314057 B | 5/2014 |
| EP | 2146243 A1 | 1/2010 |
| JP | 2005-093742 A | 4/2005 |
| JP | 2010-278396 A | 12/2010 |
| WO | 2013/066318 A1 | 5/2013 |
| WO | 2013/165376 A1 | 11/2013 |
| WO | 2014/021781 A1 | 2/2014 |
| WO | WO-2014209398 A1 | 12/2014 |
| WO | 2016/018285 A1 | 2/2016 |
| WO | 2016/122547 A1 | 8/2016 |
| WO | 2017/123245 A1 | 7/2017 |

OTHER PUBLICATIONS

International Search Report and Written Opinion received for PCT Patent Application No. PCT/US19/29478, dated Aug. 27, 2019, 13 pages.

Martijn J.R. Heck et ,al., "Hybrid Silicon Photonics for Optical Interconnects," IEEE Journal of Selected Topics in Quantum Electronics, Aug. 13, 2010, pp. 1-14.

Kissinger et al., "Void-free silicon-wafer-bond strengthening in the 200-400 ° C. range", Sens. Actuators. A 36, 1993, pp. 149-156.

Zhiping Zhou et al. "On-chip light sources for silicon photonics" Light: Science & Applications, www.natrure.com/lsa Aug. 5, 2015, pp. 1-13.

Yu Xia, "Tetracene air-gap single-crystal field-effect transistors." Applied Physics Letters 90, 162106, 2007, 3 pages, <http://rogers.matse.illinois.edu/files/2007/tetraceneapl.pdf>.

Youngho Jung et al. "Hybrid integration of III-V semiconductor lasers on silicon waveguides using optofluidic microbubble manipulation" Scientific Reports www.nature.com/scientificreports, published Jul. 19, 2016, pp. 1-7.

Y. Tang et al., Optics Express, Mar. 28, 2011, vol. 9, No. 7, pp. 5811-5816.

Xiaonan Chen et al., "Active Transmission Control Based on Photonic-Crystal MOS Capacitor," Photonic Crystal Materials and Devices VI, Jan. 23, 2007, Proc. of SPIE vol. 6480 pp. 1-9.

Xianshu Luo et al. "High-throughput multiple dies-to-wafer bonding technology and III/V-on-Si hybrid laser for heterogeneous integration of optoelectronic integrated circuits" www.Frontiersin.org published Apr. 7, 2015, pp. 1-22.

Sysak et al., "Hybrid Silicon Laser Technology: A Thermal Perspective," Selected Topics in Quantum Electronics, IEEE Journal of 17.6, 2011, pp. 1490-1498.

Supplementary European Search Report and Search Opinion Received for EP Application No. 12875835.6, dated Feb. 18, 2016, 14 pages.

Partial Supplementary European Search Report received in EP Application No. 12875835.6, dated Oct. 11, 2015, 6 pages.

Masahiro Yanagisawa et al. "Film-Level hybrid integration of AlGaAs laser diode with glass waveguide on Si substrate" IEEEPhotonics Technology Letters, vol. 4, No. 1, Jan. 1992, pp. 21-23.

Liang, D., "III-V-on-Silicon Hybrid Integration, Materials, Devices, and Applications," IEEE Winter Topicals, 2011, pp. 151-152.

Liang et al, "Highly efficient vertical outgassing channels for low-temperature InP-to-silicon direct wafer bonding on the silicon-on-insulator substrate"; 2008; pp. 1560-1568.

Liang D et al: "Optimization of Hybrid Silicon Microring Lasers", IEEE Photonics Journal, IEEE, USA, vol. 3, No. 3, Jun. 28, 2011 (Jun. 28, 2011), pp. 580-587.

Li, J., "Wafer Scale Fiexible Interconnect Fabrication for Heierogeneous Integration," (Doctoral Dissertation), TU Delft, Deifl University of Technology, Oct. 26, 2015, 94 pages.

Kuldeep Amarnath, "Active Microring and Microdisk Optical Resonators on Indium Phosphide," Dissertation, 2006, pp. 1-163, Available at: <drum.lib.umd.edu/bitstream/1903/3513/1/umi-umd-3343.pdf>.

Jeong, Y-K et al.; "High Quality High-k MIM Capacitor by Ta2O5/HfO2/Ta2O5 Multi-layered Dielectric and NH3 Plasma Interface Treatments for Mixed-Signal/RF Applications,"; Jun. 15-17, 2004: pp. 222-223.

International Search Report and Written Opinion received for PCT Patent Application No. PCT/US2015/048365, dated May 30, 2016, 11 pages.

International Search Report and Written Opinion received for PCT Patent Application No. PCT/US2014/048833, dated Apr. 29, 2015, 9 pages.

International Search Report and Written Opinion received for PCT Patent Application No. PCT/US2014/048818, dated Apr. 22, 2015, 11 pages.

International Search Report and Written Opinion received for PCT Patent Application No. PCT/US2012/035893, dated Dec. 26, 2012, 8 pages.

International Search Report and Written Opinion received for PCT Patent Application No. PCT/US2011/058756, dated Aug. 27, 2012, 6 pages.

International Search Report and Written Opinion received for PCT Patent Application No. PCT/US2011/050083, dated May 1, 2012, 7 pages.

International Search Report and Written Opinion received for PCT Patent Application No. PCT/US16/24823, dated Dec. 26, 2016, 10 pages.

International Search Report and Written Opinion received for PCT Application No. PCT/US2016/013605, dated Oct. 13, 2016, 10 pages.

International Preliminary Report on Patentability received for PCT Patent Application No. PCT/US2015/048365, dated Mar. 15, 2018, 10 pages.

International Preliminary Report on Patentability received for PCT Patent Application No. PCT/US2014/048833, dated Feb. 9, 2017, 7 pages.

International Preliminary Report on Patentability received for PCT Patent Application No. PCT/US2014/048818, dated Feb. 9, 2017, 10 pages.

International Preliminary Report on Patentability received for PCT Patent Application No. PCT/US2011/058756, dated May 15, 2014, 5 pages.

International Preliminary Report on Patentability received for PCT Patent Application No. PCT/US2011/050083, dated Mar. 13, 2014, 6 pages.

International Preliminary Report on Patentability received for PCT Patent Application No. PCT/US16/24823, dated Oct. 11, 2018, 9 pages.

International Preliminary Report on Patentability received for PCT Application No. PCT/US2016/013605, dated Jul. 26, 2018, 9 pages.

International Preliminary Report on Patentability received for PCT Application No. PCT/US2012/035893, dated Nov. 13, 2014, 7 pages.

Hirakawa. K. et al., High Resolution Subpixel and Subframe Rendering for Color Flatpanel and Projector Displays, 2011 18th IEEE International Conference, Sep. 11-14, 2011, pp. 1725-1728.

Gosh, S., et al; "Investigations on Thermal Stress Relief Mechanism Using Air-gapped Sio2 Nanotemplates During Epitaxial Growth of Ge on Si and Corresponding Hole Mobility Improvement"; Apr. 20, 2012; 4 pages.

Gosh, S., et al; "Experimental and Theoretical Investigation of Thermal Stress Relief During Epitaxial Growth of Ge on Si Using Air-gapped Sio2 Nanotemplates"; Oct. 2011; 9 pages.

(56) References Cited

OTHER PUBLICATIONS

Google search (hybrid laser, waveguide, substrate) pp. 1-2.
G. Morthier et al., "Microdisk Lasers Heterogeneously Integrated on Silicon for Low-Power, High-Speed Optical Switching," Photonics Society Newsletter, Jun. 2010, vol. 24, Issue 3, pp. 5-10, IEEE, Available at: <lecture.ecc.u-tokyo.ac.jp/.about.tlecwada/Optics%20&%20Photonics/pres-entation%20files/paper9.pdf>.
European Search Report and Search Opinion Received for EP Application No. 118751110, dated Jul. 30, 2015, 3 pages.
European Search Report and Search Opinion Received for EP Application No. 11871524.2, dated Jul. 16, 2015, 8 pages.
Delphine Marris-Morini et al., "D006—State of the art on Photonics on CMOS," Nov. 30, 2009, pp. 1-70, Available at: <helios-project.eu/content/download/326/2147/tile/HELIOS.sub.—D006.pd-f>.
D. Dai et al., High speed modulation of hybrid silicon evanescent lasers, IPNRA, Jul. 12 2009. paper IMC1.
Caglar Duman etl al. "Comparative modeling results for ridge waveguide MOW and hybrid Si/III-V lasers" Journal of radiation research and applied sciences, Nov. 17, 2017, pp. 1-5.
Basak, J. et al., Developments in Gigascale Silicon Optical Modulators Using Free Carrier Dispersion Mechanisms, Apr. 15, 2008, Advances in Optical Technologies, vol. 2008, 10 pages.
Ansheng Liu et al, "A High-Speed Silicon Optical Modulator Based on a Metal-Oxide-Semiconductor Capacitor," Nature-427, Feb. 12, 2004, Nature Publishing Group, pp. 615-618.
Alexander W. Fang "Electrically pumped hybrid AlGaInAs-silicon evanescent laser" Optical Society of America, Oct. 2, 2016/ vol. 14, No. 20/Optics Express, pp. 9203-9210.
A. Liu et al., Optics Express, Jan. 22, 2007, vol. 15, No. 2, pp. 660-668.
Impact of Interfacial Layer and Transition Region on Gate Current Performance for High-K Gate Dielectric Stack: Its Trade off With Gate Capacitance, (Research Paper), Electron Devices, IEEE Transacfons on 50.2, Mar. 2003, pp, 433-439.

* cited by examiner

DEVICES HAVING SUBSTRATES WITH SELECTIVE AIRGAP REGIONS

BACKGROUND

Optical communication is becoming more prevalent in computer systems and network communications. Optical signals can propagate in a variety of different media, such as optical waveguides, between different computer systems and network devices. Modern Integrated Circuits (ICs) designed to facilitate optical devices have a profound impact on computing, electronics, and photonics.

Heteroepitaxy, also referred to as monolithic integration, is a powerful technique to integrate different materials on a same substrate for special functionalities or enhanced device performance. Heteroepitaxy is often used to grow crystalline films of materials for which crystals cannot otherwise be easily obtained and to fabricate integrated crystalline layers of different materials. Heteroepitaxy can be used to grow device materials in electronic and photonic devices.

BRIEF DESCRIPTION OF THE DRAWINGS

The following detailed description references the drawings, wherein.

DETAILED DESCRIPTION

Heteroepitaxy is a powerful technique to integrate different materials together on a substrate for special functionalities or enhanced device performance. Heteroepitaxy is useful technique for the manufacture of various devices used in photonic and electronic computing applications. However, material property incompatibilities like differing lattice constants or thermal expansion coefficients (CTE) can result in defects in heteroepitaxially grown materials. Those defects may have a detrimental effect on microelectronic and photonic devices. These challenges contribute to the difficulty of manufacturing high-performance, reliable devices using direct bandgap compound semiconductors heteroepitaxially grown on silicon.

As a result, effort has been spent into developing ways to minimize defect formation and propagation. The use of intermediate layers, lateral overgrowth methods, and quantum dot active regions have been proposed. However, these solutions do not adequately eliminate defect formation at the heteroepitaxial interface, and they do not produce devices with adequate reliability. Another solution involves limiting functional layers to be within a critical thickness, under which defect formation is mostly mitigated. However, many functional layer thicknesses are above corresponding critical thickness. Furthermore, wafer bonding is a technique often used to join device layers. Wafer bonding, however, may result in extra fabrication cost and size mismatches with substrates can impact overall device yield.

Examples disclosed herein address these challenges by providing for devices having substrates with selective airgap regions for mitigating defects resulting from heteroepitaxial growth of device materials. Example devices may include a first semiconductor layer disposed on a substrate. The first semiconductor layer may have a window cut through a face, where etching a selective airgap region in the substrate is enabled via the window. A second semiconductor layer may be heteroepitaxially grown on the face of the first semiconductor layer so that at least a portion of the second semiconductor layer is aligned over the selective air gap region. The first semiconductor layer may be elastic enough, due to the selective air gap region, to allow elastic deformation caused by the heteroepitaxial (i.e. monolithic) growth of the second semiconductor layer, thereby mitigating the strain experienced by the second semiconductor layer. In this manner, example devices provide for mitigating of defects caused by heteroepitaxial growth of the second semiconductor layer without the use of wafer bonding and other limiting processes.

Figure 1:
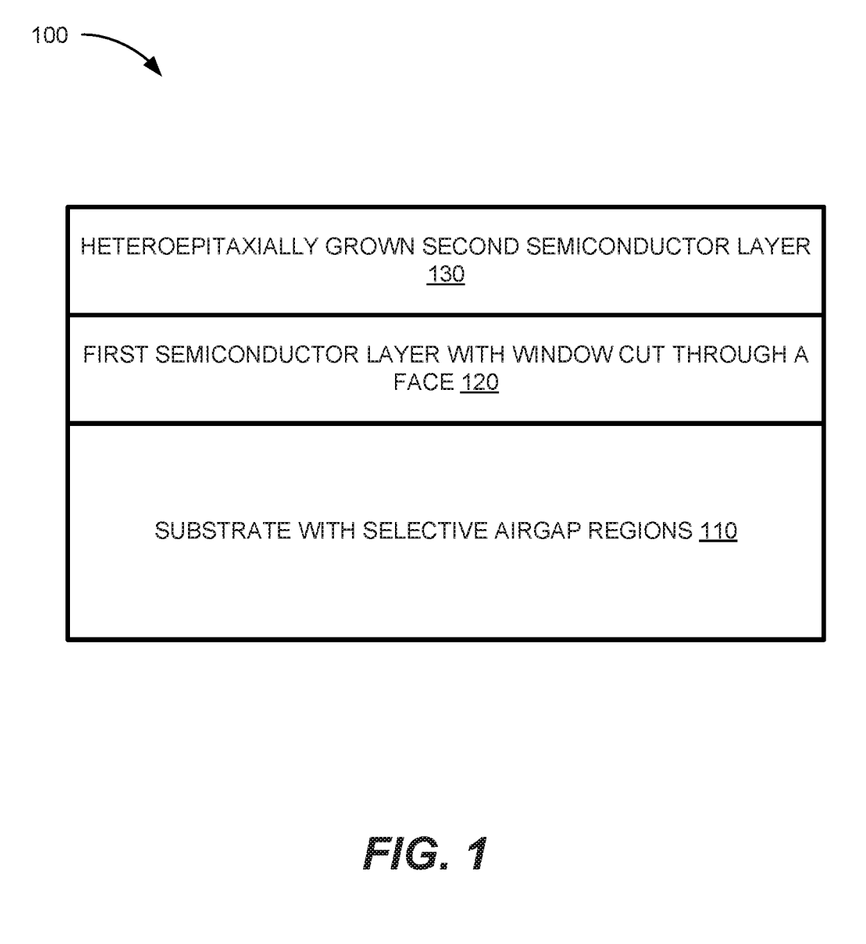
FIG. 1 is a conceptual cross-sectional view of an example device having a substrate with a selective airgap region.

Referring now to the drawings, FIG. 1 illustrates a conceptual cross-sectional view of an example device 100 having a substrate with a selective airgap region 110. Device 100 may include substrate 110, a first semiconductor layer 120 disposed on the substrate 110, and a second semiconductor layer 130 heteroepitaxially grown on the first semiconductor layer 120. Device 100 may be a device or system that can be implemented in a variety of computer or network systems, such as optical computing and communications.

Substrate 110 may be a wafer or solid substance onto which other substances are adhered. Substrate 110 may serve as a foundation for microelectronic and photonic devices, and may be the base that electronic and photonic devices are deposited. Substrate 110 may, in some examples, be a thin slice of material, which may include semiconductors such as silicon and germanium, compound semiconductors such as gallium arsenide (GaAs) and indium phosphide (InP), or dielectric insulators such as silicon oxide and aluminum oxide. In some examples, substrate 110 may include multiple materials, including but not limited to the examples listed above. Furthermore, in some examples, substrate 110 may include multiple layers, with each layer having a different material.

First semiconductor layer 120 may be disposed on the substrate 110. First semiconductor layer 120 may be a relatively thin device layer and may have a window cut through a face of the first semiconductor layer 120 to the substrate 110. The window may allow access to the underlying substrate 110 through the first semiconductor layer 120, and may be defined, for example, by lithography and cut out by etching. The etching may be a chemical hydrofluoric acid (HF) etch or it may be, for example, an anisotropic deep reactive ion etch (DRIE). For example, the first semiconductor layer 120 can be anisotropically etched with one or more plasma gases, such as carbon tetrafluoride ($CF_4$) containing fluorine ions, in a commercially available etcher, such as a parallel plate DRIE apparatus or, alternatively, an electron cyclotron resonance (ECR) plasma reactor to replicate the mask pattern of the window in first semiconductor layer 120. The first semiconductor layer may comprise a variety of semiconducting materials, including but not limited to silicon, germanium, and compound semiconductors such as GaAs and InP.

A selective airgap region may be etched out of the substrate 110 material between a portion of the substrate 110 and a portion of first semiconductor layer 120. In other words, the selective airgap region may be etched out of the portion of the substrate 110 that is directly coupled to first semiconductor layer 120. In some examples, the selective airgap is significantly larger across the width of the substrate 110 than it is deep into the substrate 110. The etching of the selective airgap region may be enabled by the window in first semiconductor layer 120. The window may allow etchants used in wet etching to access the substrate 110 to etch out the selective airgap region.

Furthermore, in some examples, substrate 110 may have a base layer and a dielectric layer. In such instances, the first semiconductor layer 120 and the substrate 110 together may represent a semiconductor-on-insulator substrate, such as silicon-on-insulator (SOI). For example, the base layer of substrate 110 and the first semiconductor layer 120 may sandwich the dielectric layer of substrate 110. In such examples, the selective airgap region may be etched out of the dielectric layer of the substrate 110. Example material configurations in such examples include GaAs—AlAs—GaAs, Si—$SiO_2$—Si, and Si—Ge—GaAs.

In some examples, a dielectric layer of the substrate 110 may have a lower refractive index than the first semiconductor layer 120. In such instances, the first semiconductor layer 120, which is directly disposed on the dielectric layer of substrate 110, may act as a waveguide layer for photonic communications. Because the first semiconductor layer 120 may have a higher refractive index than the dielectric layer of the substrate, an optical signal propagating within first semiconductor layer 120 above a total internal reflection angle associated with the first semiconductor layer 120 and the dielectric layer of substrate 110 may experience total internal reflection within first semiconductor layer 120, which thereby serves as a waveguide.

Continuing to refer to FIG. 1, a second semiconductor layer 130 may be heteroepitaxially grown on a face of the first semiconductor layer 120 so that a portion of the second semiconductor layer 130 is aligned over a selective airgap region of substrate 110. Second semiconductor layer 130 may be, for example, an active region of device 100. For example, second semiconductor layer 130 may provide various functions for the device, including optical signal production, modulation, absorption, transport, etc. Additionally or as an alternative, second semiconductor layer 130 may be an electronic device such as a high speed transistor. Example materials for second semiconductor layer 130 include GaAs and InP. In some examples, the second semiconductor layer 130 may include a stack of multiple layers, such as Ge—GaAs or Ge—GaAs—AlGaAs—GaAs. Additional example materials for the second semiconductor layer 130 include other group III-V and group II-VI direct bandgap semiconductors.

The presence of the selective airgap region aligned with the second semiconductor layer 130 may mitigate the formation and propagation of defects in the second semiconductor layer 130. For example, selective airgap region may allow the freestanding portions of the first semiconductor layer 120 to elastically deform to accommodate for stress generated by mismatch between first semiconductor layer 120 and second semiconductor layer 130. For example, the mismatch may be between lattice constants and CTEs. By concentrating the stress on first semiconductor layer 120, the freestanding portions of second semiconductor 130—that is portions of the layer 130 that is aligned over the selective airgap region—may be less prone to defect formation and propagation.

Furthermore, the thickness of first semiconductor layer 120 may, in some examples, be below a critical thickness, under which defect formation is largely reduced. As a result, defect formation within first semiconductor 120 may also be mitigated.

Figure 2A:
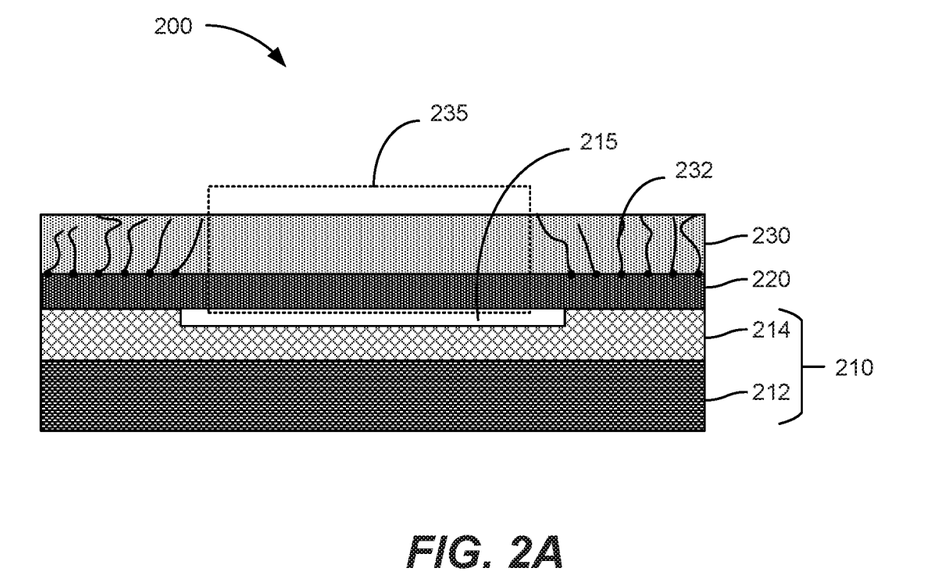
FIG. 2A is a cross-sectional view of an example device having a substrate with a selective airgap region.

FIG. 2A shows a cross-sectional view of an example device 200 having a substrate 210 with a selective airgap region 215. Device 200 may be analogous to device 100 of FIG. 1. Device 200 may be a device or system that can be implemented in a variety of computer or network systems, such as optical computing and communications.

Substrate 210 may be a foundation on which electronic and photonic devices are deposited. As illustrated by FIG. 2A, substrate 210 may include a base layer 212 and a dielectric layer 214. In some examples, base layer 212 may include a semiconductor such as Si, Ge, GaAs, and InP. Dielectric layer may include example electrically insulating materials such as $Al_2O_3$, $SiO_2$, $SiN_x$, etc.

First semiconductor layer 220 may be disposed on the dielectric layer 214 of substrate 210. First semiconductor layer 220 may be a relatively thin device layer comprising a semiconductor such as Si, Ge, GaAs, and InP. In some examples, base layer 212 of substrate 210, dielectric layer 214 of substrate 210, and first semiconductor layer 220 may represent a semiconductor-on-insulator substrate.

Although not shown in FIG. 2A, first semiconductor layer 220 may have a window cut into a face of first semiconductor layer 220. The face may be cut through to the dielectric layer 214 of substrate 210. The window may enable the etching of a selective airgap region 215 in the dielectric layer 214. For example, the window may allow access by a chemical etchant, such as HF, to the dielectric layer 214.

Second semiconductor layer 230 may be heteroepitaxially grown on a face of the first semiconductor layer 220 so that a portion of the second semiconductor layer 230 is aligned over selective airgap region 215 of substrate 210. Example materials for second semiconductor layer 130 include GaAs and InP. In some examples, the second semiconductor layer 130 may include a layered stack of multiple layers, such as Ge—GaAs or Ge—GaAs—AlGaAs—GaAs. Additional example materials for the second semiconductor layer 130 include other group III-V and II-VI direct bandgap semiconductors.

The presence of the selective airgap region 215 aligned with the second semiconductor layer 230 may mitigate the formation and propagation of defects 232 in a freestanding region 235 of first semiconductor layer 220 and second semiconductor layer 230. For example, selective airgap region 215 may allow the freestanding portions of the first semiconductor layer 220 to elastically deform to accommodate for stress generated by mismatch between first semiconductor layer 220 and second semiconductor layer 230. By concentrating the stress on first semiconductor layer 220, the freestanding portions of second semiconductor layer 230 may be less prone to defect formation and propagation. However, as illustrated in FIG. 2A, defects 232 may form and propagate in the regions of second semiconductor layer 230 that is not part of freestanding region 235. That this, the regions of second semiconductor layer 230 that may not benefit from the elastic properties of first semiconductor layer 210 over the selective airgap region 215. Furthermore in some examples, the thickness of first semiconductor layer 220 may be below a critical thickness, under which defect formation is largely reduced. As a result, defect formation within first semiconductor 220 may also be mitigated.

Figure 2B:
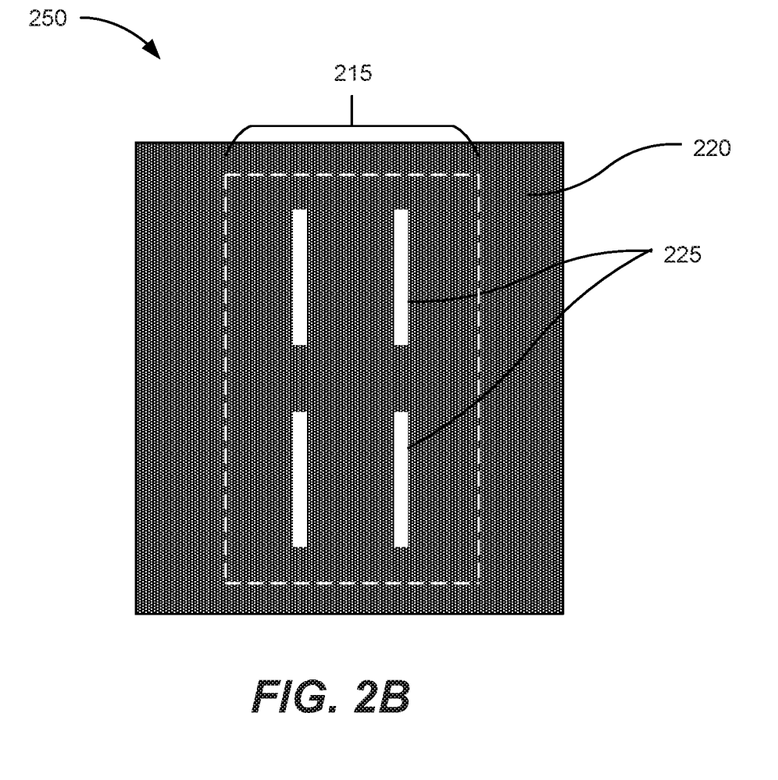
FIG. 2B is a top-down view of an example device having a substrate with a selective airgap region.

FIG. 2B shows top-down view of an example device 250 having a substrate with a selective airgap region. For illustration purposes, FIG. 2B may represent a top-down view of the example device 200 of FIG. 2A. Device 250 is shown without a second semiconductor layer to illustrate the first semiconductor layer 220. As described above, first semiconductor layer 220 may be disposed on top of a substrate. The substrate may include a base layer and a dielectric layer, where the dielectric layer is directly coupled to the first semiconductor layer 220.

First semiconductor layer 220 may have a plurality of windows 225 cut into its face. The windows 225 may allow access to the underlying dielectric layer of the substrate through the first semiconductor layer 220. In some examples, first semiconductor layer 220 may have one window, while in other examples, such as that shown in FIG. 2B, the first semiconductor layer 220 may have multiple windows 225. The windows 225 may be defined by lithography and cut out by etching.

The windows 225 may enable the etching of the selective airgap region in the dielectric layer of the substrate underneath. The selective airgap region 215 under first semiconductor layer 220 may be emphasized in FIG. 2B by the dotted line. In some examples, the windows 225 may allow etchants used in wet etching to access the substrate below to etch out the selective airgap region 215.

Figure 3:
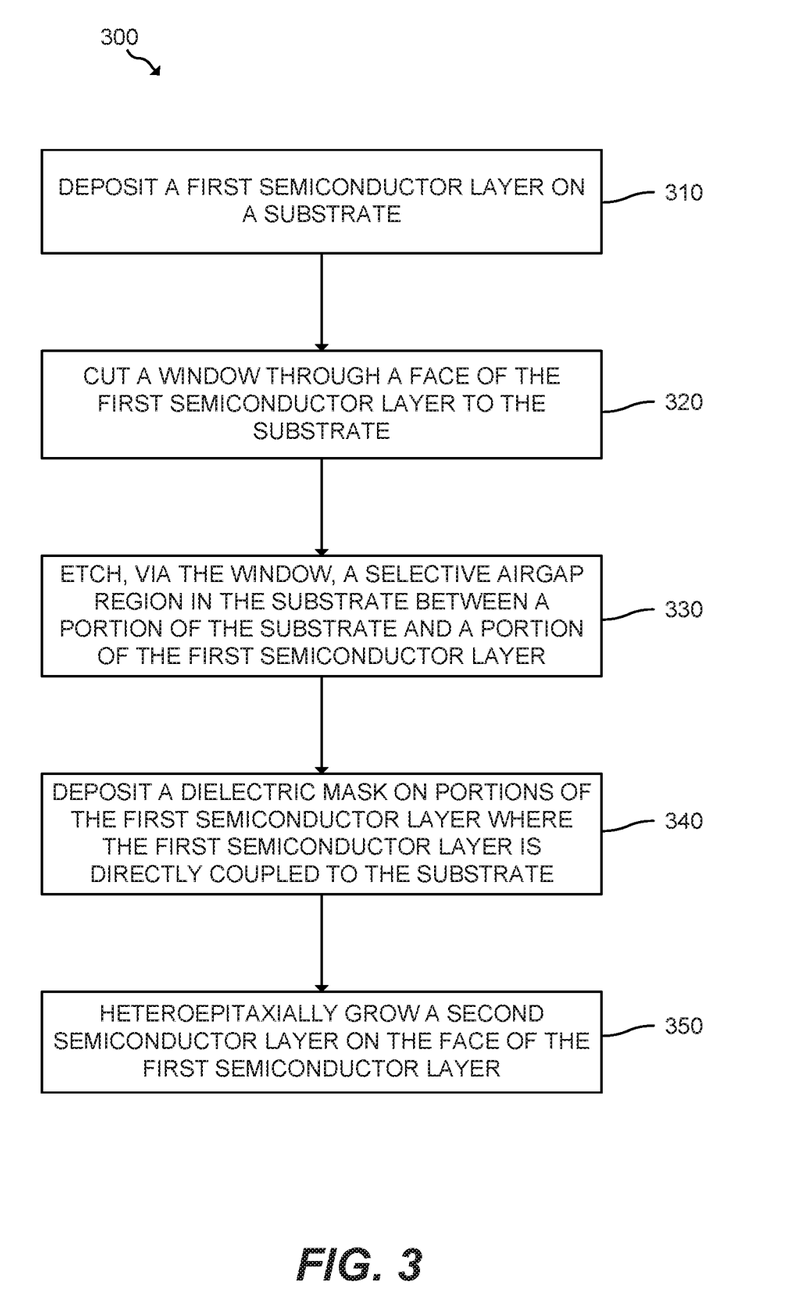
FIG. 3 is a flowchart of an example method for manufacturing a device having a substrate with a selective airgap region.
Figure 4:
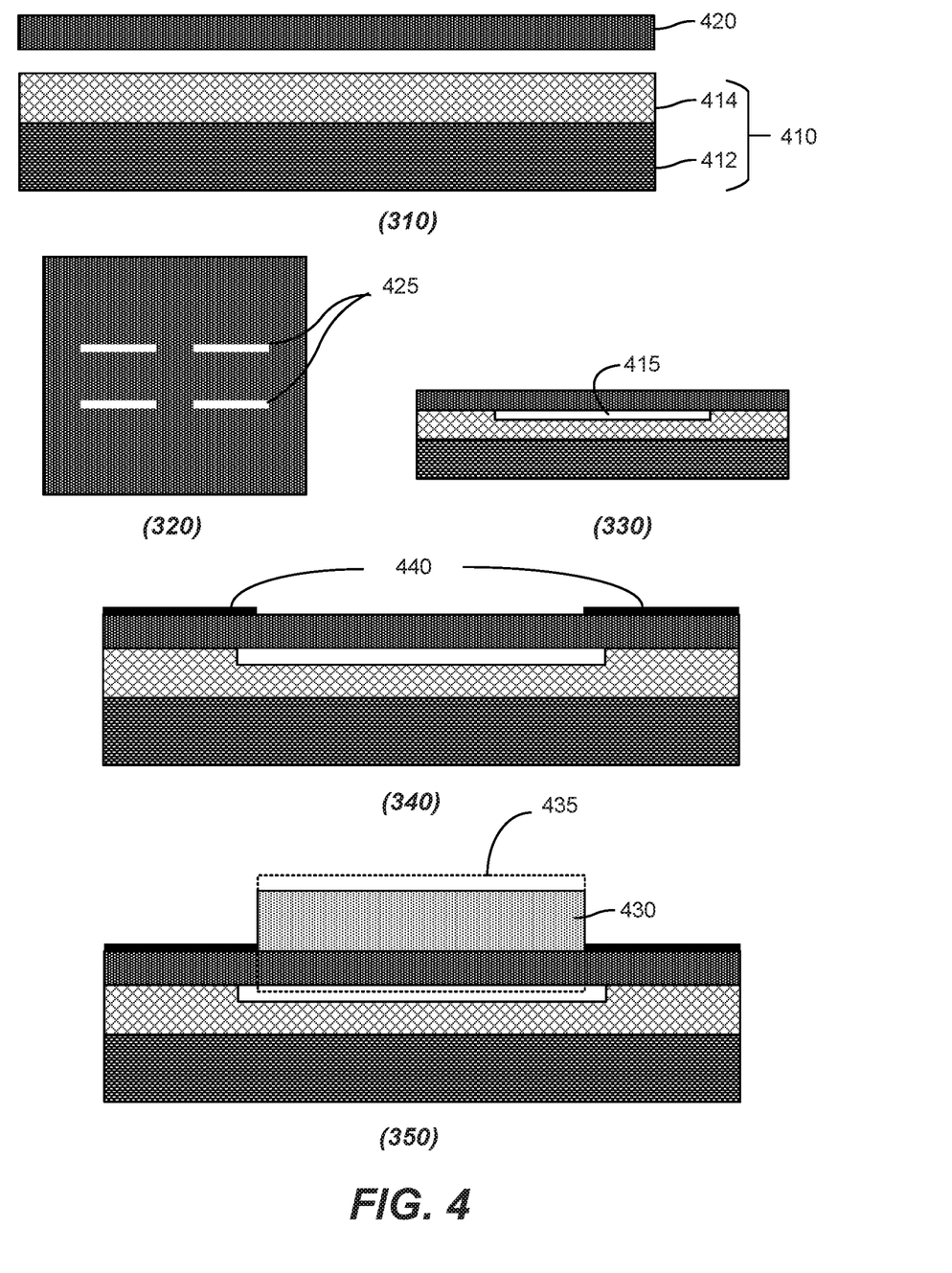
FIG. 4 are cross-sectional and top-down illustrations of the example method for manufacturing illustrated by FIG. 3.

FIG. 3 depicts a flowchart of an example method 300 for manufacturing a device having a substrate with a selective airgap region. FIG. 3 is illustrated in the examples of FIG. 4. Accordingly, the description of FIG. 3 herein makes references to FIG. 4. However, other suitable candidates for illustration of method 300 should be apparent, including the examples provided in FIGS. 1, 2A, and 2B.

In an operation 310, a first semiconductor layer may be deposited on a substrate. In FIG. 4 step (310), first semiconductor layer 420 may be deposited on substrate 410, which itself may include a base layer 412 and a dielectric layer 414. In some examples, the first semiconductor layer 420 may be deposited on the substrate 410 by a variety of methods, including wafer bonding, ion beam assisted deposition, sputtering, atomic layer deposition, evaporation, and chemical vapor deposition.

In an operation 320, a window may be cut through a face of the first semiconductor layer to the substrate. In FIG. 4 step (320), windows 425 are cut through a face of first semiconductor layer 420. The windows 425 may allow access to the underlying dielectric layer 414 of substrate 410 through the first semiconductor layer 420. For example, windows 425 may be defined by lithography and cut out by etching.

In an operation 330, a selective airgap region may be etched, via the window, between a portion of the substrate and a portion of the first semiconductor layer. In FIG. 4 step (330), a selective airgap region 415 may be etched in dielectric layer 414 of substrate 410 via windows 425.

In an operation 340, a dielectric mask may be deposited on portions of the first semiconductor layer where the first semiconductor layer is directly coupled to the substrate. In other words, the dielectric mask is deposited on the portions of the first semiconductor layer where there is no selective airgap region in the parts of the substrate directly below the portions of the first semiconductor layer. This is illustrated in FIG. 4 step (340). Dielectric mask 440 is deposited on first semiconductor layer 420 where selective airgap region 415 is not underneath the first semiconductor layer. The dielectric mask 440 may include a material that inhibits epitaxial growth, such as that to take place in operation 350. In some examples, such as the one in FIG. 4, dielectric mask 440 may extend over a small portion of the selective airgap region 415. This may be done for redundancy to counteract any potential defect formation in the material layers to be formed.

In an operation 350, a second semiconductor layer may be heteroepitaxially grown on the face of the first semiconductor layer. In FIG. 4 step (350), a second semiconductor layer 430 is heteroepitaxially grown on the first semiconductor layer 420. The second semiconductor layer 430 may grow on the exposed surface of the first semiconductor layer 420, while growth of the second semiconductor layer 430 may be inhibited in areas covered by the dielectric mask 440. Due to the elasticity provided by the first semiconductor layer 420, second semiconductor layer 430, which may be completely within freestanding region 435 in this example, may be heteroepitaxially grown with mitigated defect formation.

Figure 5:
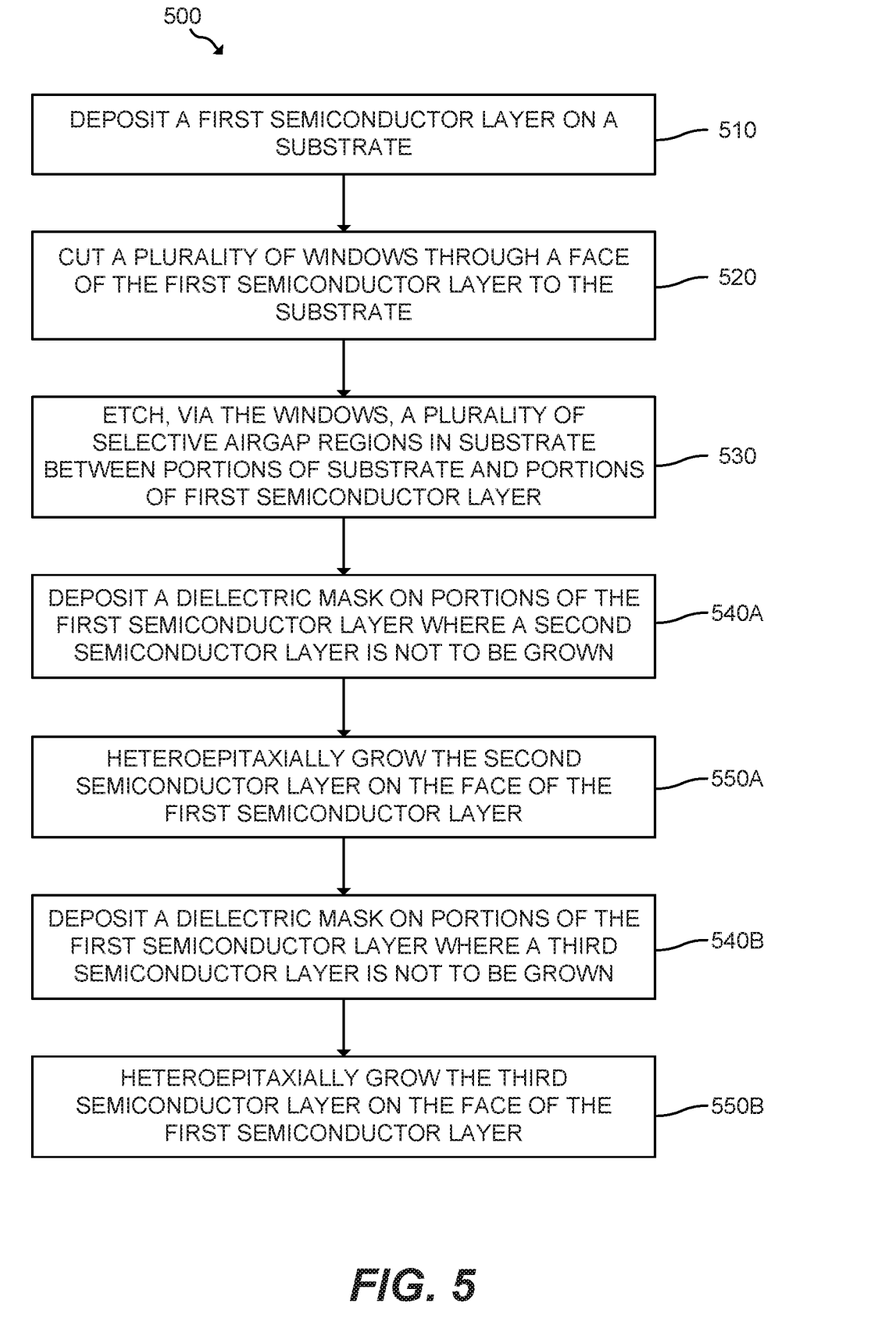
FIG. 5 is a flowchart of an example method for manufacturing a device having a substrate with a plurality of selective airgap regions.
Figure 6:
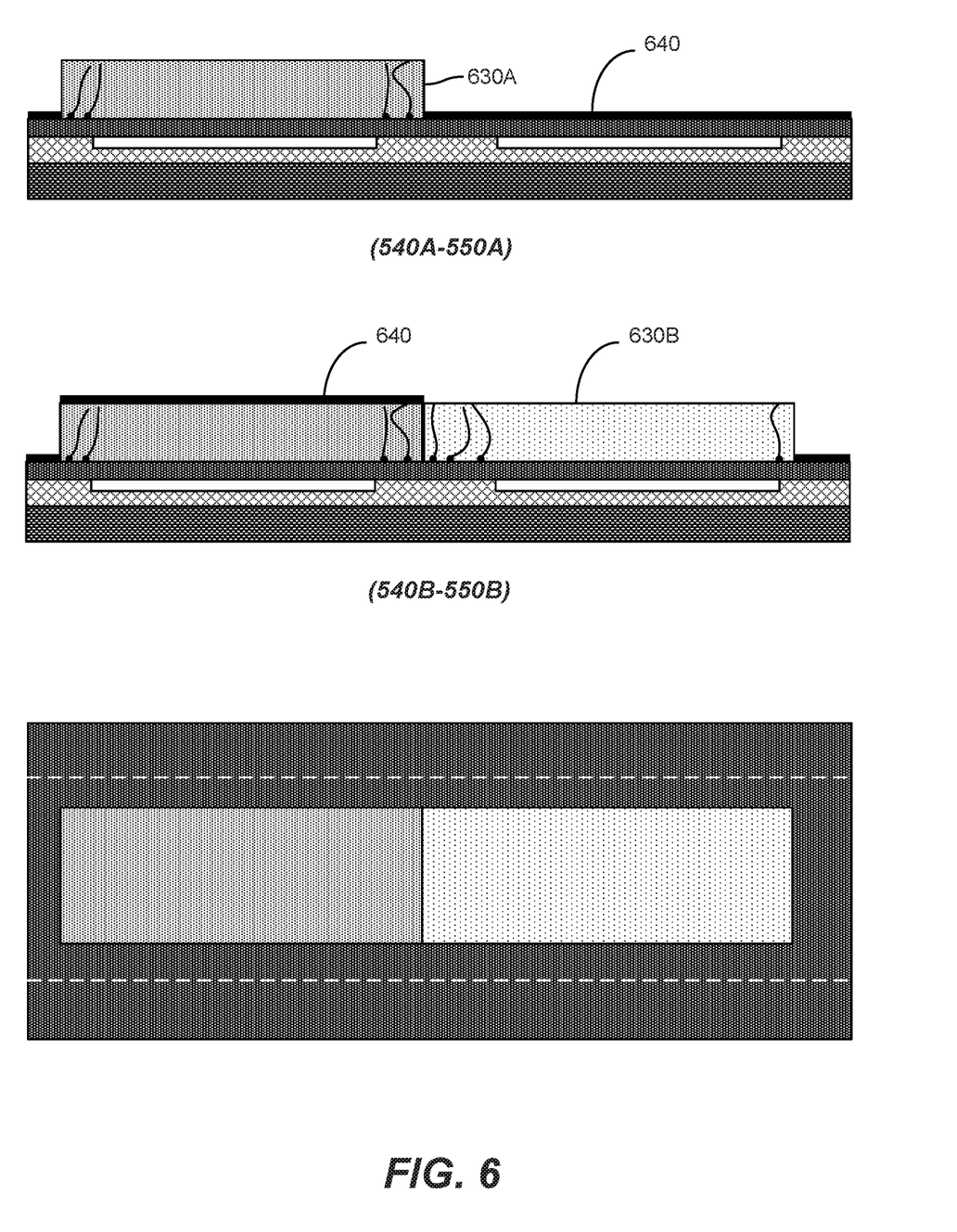
FIG. 6 is a cross-sectional and top-down illustrations of the example method for manufacturing illustrated by FIG. 5.

FIG. 5 illustrates a flowchart of an example method 500 for manufacturing a device having a substrate with a plurality of selective airgap regions. FIG. 5 is illustrated in the examples of FIG. 6. Accordingly, the description of FIG. 5 herein makes references to FIG. 6. However, other suitable candidates for illustration of method 500 should be apparent, including the examples provided in FIGS. 1, 2A, and 2B.

In an operation 510, a first semiconductor layer is deposited on a substrate. In an operation 520, a plurality of windows may be cut through a face of the first semiconductor layer to the substrate. In an operation 530, a plurality of selective airgap regions may be etched in the substrate via the windows cut in operation 520.

In an operation 540A, a dielectric mask may be deposited on portions of the first semiconductor layer where a second semiconductor layer is not to be grown. This is illustrated in FIG. 6 step (540A-550A). Dielectric mask 640 is deposited on the first semiconductor layer of the device to cover the areas where the second semiconductor layer 630A is not to be grown.

In an operation 550A, the second semiconductor layer is heteroepitaxially grown on the face of the first semiconductor layer. In FIG. 6 step (540A-550A), second semiconductor layer 630A is grown on the first semiconductor surface. Second semiconductor layer 630A may be an active device, such as a photonic device like a laser or the like. Alternatively in some examples, second semiconductor layer 630A may be an active electronic device such as a high speed transistor. FIG. 6 illustrates that the defect formation in second semiconductor layer 630A is mitigated in the areas aligned with a selective airgap region, whereas the defects are concentrated in the regions of second semiconductor layer 630A that is directly coupled to the first semiconductor layer.

Similarly, in an operation 540B, a dielectric mask may be deposited on portions of the first semiconductor layer where a third semiconductor layer is not to be grown. This is illustrated in FIG. 6 step (540B-550B). Dielectric mask 640 is deposited on the first semiconductor layer of the device to cover the areas where the third semiconductor layer 630B is not to be grown. For example, the dielectric mask 640 is also deposited on top of the second semiconductor layer 630A grown in operation 550A so as to prevent growth of the third semiconductor layer 630B on top of the second semiconductor layer 630A. It should be noted that in some instances, an additional step of removing the dielectric mask 640 may be taken between the growths of subsequent semiconductor layers.

In an operation 550B, the third semiconductor layer is heteroepitaxially grown on the face of the first semiconductor layer. In FIG. 6 step (540B-550B), third semiconductor layer 630B is grown on the first semiconductor surface. Third semiconductor layer 630B may be an active device, such as a photonic device like a laser, modulator, waveguide, or the like. Alternatively in some examples, third semiconductor layer 630B may be an active electronic device such as a high speed transistor. FIG. 6 illustrates that the defect formation in third semiconductor layer 630B is mitigated in the areas aligned with a selective airgap region, whereas the defects are concentrated in the regions of third semiconductor layer 630B that is directly coupled to the first semiconductor layer.

The final diagram in FIG. 6 illustrates a top-down view of an example device manufactured by method 500 of FIG. 5. A first active layer (such as what is referred to as second semiconductor layer 630A) may be grown directly adjacent to a second active layer (such as what is referred to as third semiconductor layer 630B). The active layers may be devices of a photonic or electronic system. For example, the first active layer may be an optical signal generator, and the second active layer may be a modulator that converts the optical signal produced by the first active layer into photonic communication.

The foregoing describes a number of examples for devices having substrates with selective airgap regions. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

Further, the sequence of operations described in connection with FIGS. 1-6 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

It should further be noted that, as used in this application and the appended claims, the singular forms "a," "an," and "the" include plural elements unless the context clearly dictates otherwise.

What is claimed is:

1. A device, comprising:
    a substrate with a selective airgap region;
    a first semiconductor layer disposed on the substrate, wherein the first semiconductor layer comprises a window cut through a face of the first semiconductor layer to the substrate, wherein etching the selective airgap region in the substrate between a portion of the substrate and a portion of the first semiconductor layer is enabled via the window such that a lower surface of the first semiconductor layer is exposed to the selective airgap region; and
    a second semiconductor layer heteroepitaxially grown on the face of the first semiconductor layer, wherein a first portion of the second semiconductor layer is aligned over the selective airgap region, and a second portion of the second semiconductor layer does not overlap the selective airgap region, wherein a defect density of the second portion of the second semiconductor layer is greater than a defect density of the first portion of the second semiconductor layer.

2. The device of claim 1, the second semiconductor layer comprises a layered stack.

3. The device of claim 1, wherein a dielectric of the substrate comprises a lower refractive index than the first semiconductor layer.

4. The device of claim 3, wherein the substrate comprises a base layer and a dielectric layer, and wherein:
    the first semiconductor layer is disposed on the dielectric layer;
    the selective airgap region is in the dielectric layer; and
    the dielectric layer comprises the dielectric with the lower refractive index than the first semiconductor layer.

5. The device of claim 1, wherein the substrate comprises a plurality of layers, each layer comprising a different material from the other layers of the plurality of layers.

6. The device of claim 1, wherein the first semiconductor layer and the substrate comprise a semiconductor-on-insulator (SOI) substrate.

7. A method, comprising:
    depositing a first semiconductor layer on a substrate;
    cutting a window through a face of the first semiconductor layer to the substrate;
    etching, via the window, the substrate to form a selective airgap region in the substrate between a portion of the substrate and a portion of the first semiconductor layer, the selective airgap region having an etched width across the substrate that is larger than an etched depth into the substrate, the etched depth being less than a total depth of the substrate, wherein the etching exposes a lower surface of the first semiconductor layer to the selective airgap region; and
    heteroepitaxially growing a second semiconductor layer on the face of the first semiconductor layer, wherein a first portion of the second semiconductor layer is aligned over the selective airgap region, and a second portion of the second semiconductor layer does not overlap the selective airgap region, wherein a defect density of the second portion of the second semiconductor layer is greater than a defect density of the first portion of the second semiconductor layer,
    wherein the selective airgap region mitigates formation of defects in the first portion of the second semiconductor layer that is aligned over the selective airgap region by allowing elastic deformation of the first semiconductor layer.

8. The method of claim 7, further comprising depositing, prior to heteroepitaxially growing the second semiconductor layer, a dielectric mask on portions of the first semiconductor layer, wherein the dielectric mask prevents growth of the second semiconductor layer on the portions of the first semiconductor layer covered by the dielectric mask.

9. The method of claim 7, wherein the substrate comprises a lower refractive index than the first semiconductor layer.

10. The method of claim 7, wherein the substrate comprises a base layer and a dielectric layer, and wherein:
    the first semiconductor layer is deposited on the dielectric layer;
    the selective airgap region is etched in the dielectric layer; and
    the dielectric layer comprises a lower refractive index than the first semiconductor layer.

11. The method of claim 7, wherein a thickness of the first semiconductor layer is below a critical thickness threshold to allow the first semiconductor layer to elastically deform to mitigate formation of defects in the first portion of the second semiconductor layer that is aligned over the selective airgap region, wherein the elastic deformation of the first semiconductor layer is caused by heteroepitaxial growing the second semiconductor layer on the face of the first semiconductor layer.

12. The method of claim 7, wherein the substrate comprises a plurality of layers, each layer comprising a different material from the other layers of the plurality of layers.

13. The method of claim 7, wherein the first semiconductor layer and the substrate comprise a semiconductor-on-insulator (SOI) substrate.

14. A method, comprising:
depositing a first semiconductor layer on a substrate;
cutting a plurality of windows through a face of the first semiconductor layer to the substrate;
etching, via the windows, the substrate to form a plurality of selective airgap regions in the substrate between portions of the substrate and portions of the first semiconductor layer, wherein each selective airgap region has an etched width across the substrate that is larger than an etched depth into the substrate, the etched depth being less than a total depth of the substrate, wherein the etching exposes a lower surface of the first semiconductor layer to the selective airgap region; and
heteroepitaxially growing a second semiconductor layer on the face of the first semiconductor layer, wherein a first portion of the second semiconductor layer is aligned over a first selective airgap region of the plurality of selective airgap regions, and a second portion of the second semiconductor layer does not overlap the first selective airgap region, wherein a defect density of the second portion of the second semiconductor layer is greater than a defect density of the first portion of the second semiconductor layer.

15. The method of claim 14, wherein a thickness of the first semiconductor layer is below a critical thickness threshold to allow the first semiconductor layer to elastically deform to mitigate formation of defects in the first portion of the second semiconductor layer that is aligned over the first selective airgap region, wherein the elastic deformation of the first semiconductor layer is caused by heteroepitaxial growing the second semiconductor layer on the face of the first semiconductor layer.

16. The method of claim 14, wherein the substrate comprises a plurality of layers, each layer comprising a different material from the other layers of the plurality of layers.

17. The method of claim 14, wherein the first semiconductor layer and the substrate comprise a semiconductor-on-insulator (SOI) substrate.

18. The method of claim 14, further comprising depositing, prior to heteroepitaxially growing the second semiconductor layer, a first dielectric mask on portions of the first semiconductor layer where the second semiconductor layer is not to be grown, wherein the first dielectric mask prevents growth of the second semiconductor layer on the portions of the first semiconductor layer covered by the first dielectric mask, wherein the first dielectric mask overlaps with a second selective airgap region of the plurality of selective airgap regions under the portions of the first semiconductor layer covered by the first dielectric mask.

19. The method of claim 18, further comprising:
after growing the second semiconductor layer, removing a portion of the first dielectric mask overlapping with the second selective airgap region; and
growing a third semiconductor layer on the face of the first semiconductor layer where the portion of the first dielectric mask overlapping with the second selective airgap region is removed, wherein a first portion of the third semiconductor layer is aligned over the second selective airgap region, and a second portion of the third semiconductor layer does not overlap the second selective airgap region, wherein a defect density of the second portion of the third semiconductor layer is greater than a defect density of the first portion of the third semiconductor layer.

20. The method of claim 19, wherein the second semiconductor layer comprises a different material and performs a different function than the third semiconductor layer.

* * * * *